United States Patent

Takada et al.

[11] Patent Number: 5,252,390
[45] Date of Patent: Oct. 12, 1993

[54] LAMINATED FILM

[75] Inventors: Toshio Takada; Takahito Terashima; Kenji Iijima, all of Kyoto; Kazunuki Yamamoto, Yamaguchi; Kazuto Hirata, Kyoto; Yoshichika Bando, Shiga, all of Japan

[73] Assignees: Ube Industries, Ltd., Ube; Kanegafuchi Chemical Industry Co., Ltd., Osaka; Nippon Steel Corporation, Ohte; TDK Corporation, Nihonbashi; Tosoh Corporation, Shinnanyo; Toyo Boseki Kabushiki Kaisha, Osaka; Nippon Mining Co., Ltd., Tokyo; NEC Corporation, Tokyo; Matsushita Electric Industrial Co., Ltd., Kadoma; Seisan Kaihatsu Kagaku Kenkyusho, Sakyo, all of Japan

[21] Appl. No.: 726,688

[22] Filed: Jun. 28, 1991

Related U.S. Application Data

[63] Continuation-in-part of Ser. No. 578,302, Sep. 5, 1990, abandoned.

[30] Foreign Application Priority Data

Sep. 5, 1989 [JP] Japan .................................. 1-229884

[51] Int. Cl.$^5$ .............................................. B32B 9/00
[52] U.S. Cl. ...................... 428/336; 428/697; 428/699; 428/701; 428/702; 428/930; 505/1; 505/701; 505/702
[58] Field of Search ............... 428/688, 697, 699, 701, 428/702, 930, 336; 505/1, 701, 702

[56] References Cited

U.S. PATENT DOCUMENTS

| | | | |
|---|---|---|---|
| 4,861,750 | 8/1989 | Nogawa et al. | 505/1 |
| 4,880,341 | 12/1990 | Gehring | 505/1 |
| 4,880,772 | 11/1989 | Pederson et al. | 505/1 |
| 4,921,823 | 5/1990 | Takano | 428/688 |
| 4,948,779 | 8/1990 | Keut et al. | 428/697 |
| 4,980,339 | 12/1990 | Setsune et al. | 428/699 |
| 5,024,992 | 8/1991 | Morris | 505/1 |
| 5,047,385 | 9/1991 | Beasley et al. | 505/1 |
| 5,053,833 | 10/1991 | Pribat et al. | 505/1 |
| 5,079,222 | 1/1992 | Yamazaki | 428/688 |
| 5,096,882 | 3/1992 | Kato et al. | 505/1 |

Primary Examiner—A. A. Turner
Attorney, Agent, or Firm—Wenderoth, Lind & Ponack

[57] ABSTRACT

A laminated film comprising at least two thin films of single crystal $LnBa_2Cu_3O_{7-x}$ wherein Ln is Y or one of lanthanoids except Pr and Tb having the (001) plane in the direction parallel with the film surface and at least one continuous thin film of $Y_2O_3$ which has a thickness of not larger than 100 Å and the (001) plane in the direction parallel with the film surface and is interposed between a pair of said thin films of single crystal $LnBa_2Cu_3O_{7-x}$, wherein the thin films of single crystal $LnBa_2Cu_3O_{7-x}$ has good superconductive properties.

3 Claims, 2 Drawing Sheets

LAMINATED FILM

This is a continuation-in-part application of Ser. No. 578,302 filed on Sep. 5, 1990 now abandoned.

BACKGROUND OF THE INVENTION

1. Field of the Invention

The present invention relates to a laminated film comprising at least two thin films of $LnBa_2Cu_3O_{7-x}$ wherein Ln is Y or one of lanthanoids except Pr and Tb which attracts attentions as a superconductor exhibiting superconductivity around 90 K and at least one thin film of $Y_2O_3$ which is interposed between a pair of the thin films of $LnBa_2Cu_3O_{7-x}$, and a method for producing such laminated film.

Such laminated film will find various applications such as Josephson tunneling junctions or other electronic devices.

2. Description of the Related Art

A thin film of a single crystal of superconductive $LnA_2Cu_3O_{7-x}$ wherein Ln is the same as defined above and A is at least on alkaline earth element having the (001) plane in the direction parallel with the film surface and its preparation are disclosed and claimed in U.S. Patent application Ser. No. 247,261 filed on Sep. 16, 1988 or EP-A 0 308 869.

It is contemplated to apply the above method in the preparation of a laminated film comprising a pair of thin films of $LnA_2Cu_3O_{7-x}$ superconductor and an insulating thin film which is interposed between the pair of the superconductor films. For example, on a suitable substrate, a thin film of a single crystal of $LnA_2Cu_3O_{7-x}$ superconductor having the (001) plane in the direction parallel with the film surface is formed by the above method, then a suitable insulating thin film is formed on the $LnA_2Cu_3O_{7-x}$ thin film, and finally a second thin film of $LnA_2Cu_3O_{7-x}$ superconductor is formed on the insulating thin film by the above method.

However, it is not sure whether or not a laminated film which can be used in the electronic devices is produced. In particular, according to a kind of the insulating thin film or a method for forming the insulating thin film, it is difficult to predict how the $LnA_2Cu_3O_{7-x}$ thin film is influenced.

When the laminated film is used as an electronic device, it is important that a pair of the $LnA_2Cu_3O_{7-x}$ thin films between which the insulating thin film is interposed have good superconductive characteristics.

To form a Josephson tunnel junction, an insulating layer should have a thickness of 50 Å or less since a high temperature superconductor has a very short coherence length. In other electronic devices, the insulating layer preferably has a thickness of 100 Å or less. Though it is necessary for the superconductor layers to be completely insulated on the both sides of the insulating layer and no short circuit should be formed. Hitherto, it has not been reported that such insulating layer for the superconductive thin layers could have been formed.

In general, in an initial stage of the thin film formation, a material has a structure like islands in a sea, and the thin film should have a thickness of 100 Å or larger to form a continuous film. In the case of epitaxial growth, it is preferable to provide an oxide which forms a continuous film at a thickness of several ten Å. However, no oxide is known that can be grown in such manner on $LnBa_2Cu_3O_{7-x}$, or no theory for predicting the presence of such oxide is present.

SUMMARY OF THE INVENTION

One object of the present invention is to provide an oxide which can insulate superconductive layers at a thickness of not larger than 100 Å.

Another object of the present invention is to provide a laminated film comprising at least two superconductive thin films and at least one insulating thin film interposed between said superconductive thin films.

According to the present invention, there is provided a laminated film comprising at least two thin films of single crystal $LnBa_2Cu_3O_{7-x}$ wherein Ln is Y or one of lanthanoids except Pr and Tb having the (001) plane in the direction parallel with the film surface and at least one continuous thin film of $Y_2O_3$ which is has a thickness of not larger than 100 Å, preferably from 10 to 100 Å and the (001) plane in the direction parallel with the film surface and is interposed between a pair of said thin films of single crystal $LnBa_2Cu_3O_{7-x}$.

DETAILED DESCRIPTION OF THE INVENTION

Figure 1:
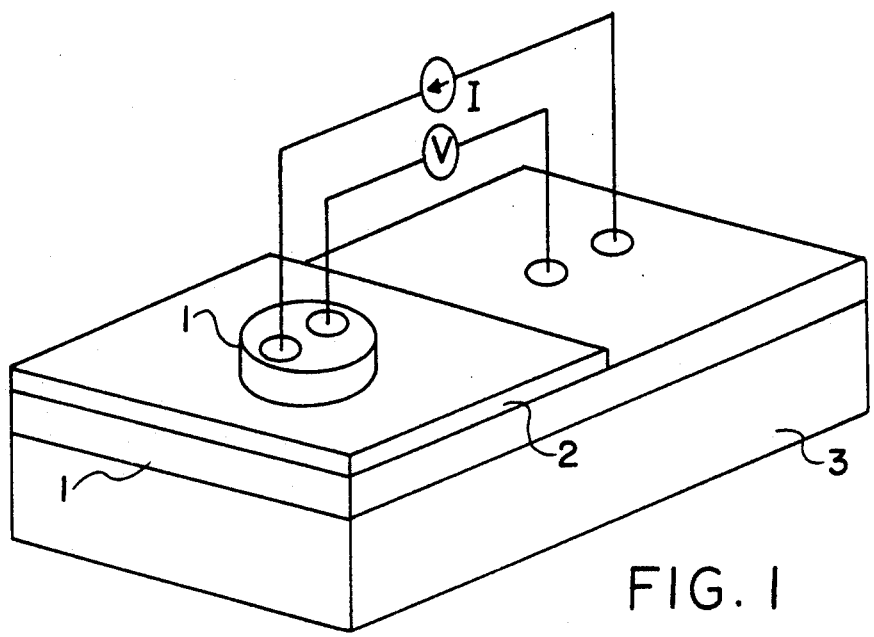
FIG. 1 schematically shows a device comprising the laminated thin film of the present invention.

The thin film of single crystal $LnBa_2Cu_3O_{7-x}$ having the (001) plane in the direction parallel with the film surface is prepared by the method described in the above U.S. Pat. application Ser. No. 247,261 the disclosure of which is hereby incorporated by reference and EP-A 0 308 869, which method basically includes following two manners:

(a) Ln, Ba and Cu are evaporated from independent evaporation sources in an atomic ratio of about 1:2:3 on a substrate in a vacuum deposition vessel while supplying an oxygen gas from a distance close to the substrate to form an oxygen-containing atmosphere having a relatively high pressure at the substrate.

(b) Ln, Ba and Cu are evaporated from independent evaporation sources in an atomic ratio of about 1:2:3 on a substrate in a vacuum deposition vessel and plasma is generated in the vessel while supplying an oxygen gas from a distance close to the substrate to form an oxygen-containing atmosphere having a relatively high pressure at the substrate.

To form the $LnBa_2Cu_3O_{7-x}$ thin film by the above manner (a) or (b) in the single crystal form having the (001) plane in the direction parallel with the film surface, a substrate should be a single crystal having its (001) plane of which is parallel with its surface. Examples of the single crystal to be used as the substrate are single crystals of $SrTiO_3$, MgO, CoO, NiO and the like.

To obtain the $LnBa_2Cu_3O_{7-x}$ thin film substantially the whole of which is in the single crystal form, the substrate is preferably heated to 500° C. or higher, preferably 520° C. or higher.

The preparation of $LnBa_2Cu_3O_{7-x}$ thin film of the present invention will be explained further in detail.

The vacuum deposition vessel is firstly evacuated to high vacuum of, for example, about $10^{-6}$ Torr. and then a small amount of the oxygen gas is continuously supplied towards the substrate from a distance close to the substrate to increase the pressure of oxygen at the substrate to $10^{-2}$ to $10^{-1}$ Torr. while an interior gas in the vessel is continuously exhausted from a suitable part of the vessel to keep the background pressure at $10^{-5}$ to $10^{-3}$ Torr. in the vessel except near the substrate. The reason why the upper limit of the background is selected to be $10^{-3}$ Torr. is that Ln, Ba and Cu in the evaporation sources are constantly evaporated without deterioration of the metals in the evaporation sources. The lower limit of $10^{-5}$ Torr. is the minimum gas pressure for generating the plasma. If the plasma is not utilized, this lower limit is not technically important.

The reason why the oxygen gas pressure is increased only near the substrate in the above step is that Cu is not oxidized to $Cu^{+2}$ if the oxygen gas pressure is lower than $10^{-3}$ Torr.

The plasma can be generated by placing a high frequency coil between the evaporation sources and the substrate and oscillating it between the coil and the vessel wall at high frequency. While the plasma generation is preferred since the reaction activities of the evaporated metals are increased, it may have some drawbacks such that the plasma attacks the desired material which is being formed if the plasma energy is too high. Therefore, an electric power for generating the plasma is preferably in the range from 50 to 500 W, more preferably around 100 W.

Ln and Ba are evaporated by electron beam and Cu is evaporated by electric resistance heating.

During evaporation of the metals by the above described evaporation means, the atomic ratio of Ln, Ba and Cu is adjusted to about 1:2:3 by controlling the electric power according to results of preliminary experiments. Namely, in the preliminary experiment, how much metal Ln, Ba or Cu is evaporated and how much oxide $Ln_2O_3$, BaO or CuO is formed by the specific electric power applied to each evaporation source per unit time are measured by a film thickness measuring device installed in the vacuum evaporation vessel near the substrate for each metal. Thereby, a relationship between an evaporation rate of each metal and the applied electric power is established and then the electric power to be applied to each evaporation source during formation of the thin film of the $LnBa_2Cu_3O_{7-x}$ single crystal is determined.

To epitaxially grow $Y_2O_3$ on the single crystal $LnBa_2Cu_3O_{7-x}$ thin film having the (001) plane in the direction parallel with the film surface, it may be contemplated to form the $Y_2O_3$ film by evaporation Y or $Y_2O_3$ under the same conditions as those for the formation of the $LnBa_2Cu_3O_{7-x}$ thin film.

The experiments by the present inventors revealed that, if the conditions are the same as those for the formation of $LnBa_2Cu_3O_{7-x}$ thin layer, $Y_2O_3$ cannot be homogeneously grown in the atomic layer unit. Under the above conditions for the formation of $LnBa_2Cu_3O_{7-x}$ thin film, the $Y_2O_3$ layer grows discontinuously, and only at the thickness of 500 Å or larger, a continuous $Y_2O_3$ thin layer can be formed. To form the continuous $Y_2O_3$ film, the oxygen pressure is kept not higher than $10^{-4}$ Torr., the substrate temperature is kept at a temperature of 600° to 800° C., and the deposition rate does not exceed 2 Å/sec. As is seen from the results of below described Example, when the deposition conditions are suitable, the $Y_2O_3$ thin film has the (001) plane in the direction parallel with its surface, and the whole of the film is in the single crystal form. On such $Y_2O_3$ film, good quality $LnBa_2Cu_3O_{7-x}$ having the (001) plane in the direction parallel with the film surface can be epitaxially grown, and the $LnBa_2Cu_3O_{7-x}$ thin films on the both sides of the $Y_2O_3$ film have good superconductive transition.

In each step of the method of the present invention, the conditions should be suitable controlled. In addition, the thin film which is being formed is to be kept under vacuum. If the thin film is exposed to air, its surface may be contaminated with materials in air so that the laminated thin film having desired properties may not be produced.

PREFERRED EMBODIMENTS OF THE INVENTION

The present invention will be illustrated by following Example.

EXAMPLE

A vacuum vessel having a diameter of 750 mm and a height of 1000 mm was evacuated to $10^{-6}$ Torr. by an oil diffusion pump.

As a substrate, a surface polished single crystal piece of MgO was used with a (001) plane forming a substrate surface (10 mm×20 mm). The substrate was placed in the vacuum vessel and heated to 650° C. heater and kept at this temperature with a Kanthal heater.

An oxygen injection nozzle was inserted in a doughnut shaped oxygen diffusion chamber surrounding the periphery of the substrate, and oxygen injected from the nozzle was once diffused in the chamber and then supplied from slits provided on an inner periphery wall of the diffusion chamber over the substrate surface. The gas pressure was increased to $10^{-2}$ to $10^{-1}$ Torr. only near the substrate, while the pressure near the evaporation sources which were placed apart from the substrate was increased to about $10^{-4}$ Torr.

Metals Y, Ba and Cu were evaporated from independent evaporation sources at such evaporation rates that the atomic ratio of Y:Ba:Cu was 1:2:3 on the substrate. For example, Y, Ba and Cu were evaporated at rates of 1 Å/sec., 2.3 Å/sec. and 1.7 Å/sec., respectively.

Between the substrate and the evaporation sources, a high-frequency coil was placed, and the high frequency was applied at 100 W so as to generate oxygen plasma which activated the evaporated metals and accelerated the reactions on the substrate.

Under the above conditions, a thin film of $YBa_2Cu_3O_{7-x}$ having a thickness of 1200 Å was formed on the substrate.

In this step, Y and Ba were evaporated by electron beam, and Cu was evaporated by resistance heating. The evaporation conditions were as follows:

Y

A metal ingot (purity: 99.9%) (50 g) was used and placed in a crucible cooled with water. The metal was evaporated by the application of an electron beam at an acceleration voltage of 5 KV and a filament current of 400 mA.

Ba

A metal ingot (purity: 99.9%) (50 g) was used and evaporated by the application of the electron beam at an acceleration voltage of 5 KV and a filament current of 100 mA.

Cu

In an alumina crucible around which a tungsten filament was wound, metal Cu particles (particle size of 2 to 3 mm, purity of 99.9999%) (10 g) were charged and heated by the application of electric current through the filament at 10 V, 30 A.

A part of a surface of the $YBa_2Cu_3O_{7-x}$ thin film was masked with manipulating a masking device which was beforehand installed in the vacuum deposition vessel while keeping vacuum in the vessel.

Then, the substrate temperature was kept at 650° C., the amount of oxygen supplied over the substrate was decreased and the oxygen pressure in the evaporation vessel was kept in the order of $10^{-5}$ Torr. Thereafter, Y was evaporated at a rate of 1 Å/sec. to form a $Y_2O_3$ thin film having a thickness 60 Å.

In the above steps, reflecting high energy electron diffraction (RHEED) photographs of the $YBa_2Cu_3O_{7-x}$ at a thickness of 1200 Å and the $Y_2O_3$ thin film at thickness of 3, 6, 9, 21 and 60 Å were taken to confirm that the $YBa_2Cu_3O_{7-x}$ thin film epitaxially grew with its (001) plane in the direction parallel with its surface and was substantially a single crystal, and that the $Y_2O_3$ thin film epitaxially grew continuously with its (001) plane in the direction parallel with its surface and was close to a single crystal.

After masking the peripheral part of the $Y_2O_3$ thin film, a second thin film of $YBa_2Cu_3O_{7-x}$ was formed under the same conditions as above to a film thickness of 1200 Å. Again, it was confirmed that the second $YBa_2Cu_3O_{7-x}$ thin film epitaxially grew with its (001) plane in the direction parallel with its surface and was substantially a single crystal.

Figure 2:
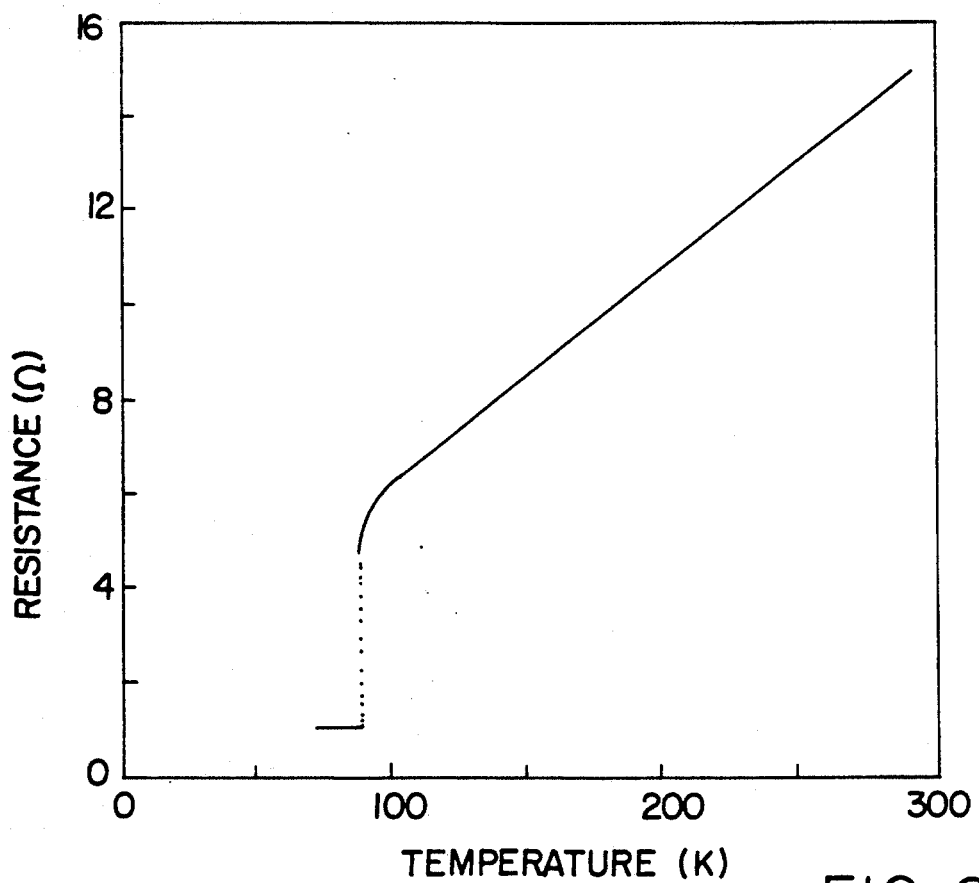
FIG. 2 shows resistance-temperature characteristic of the laminated thin film prepared in Example.
Figure 3:
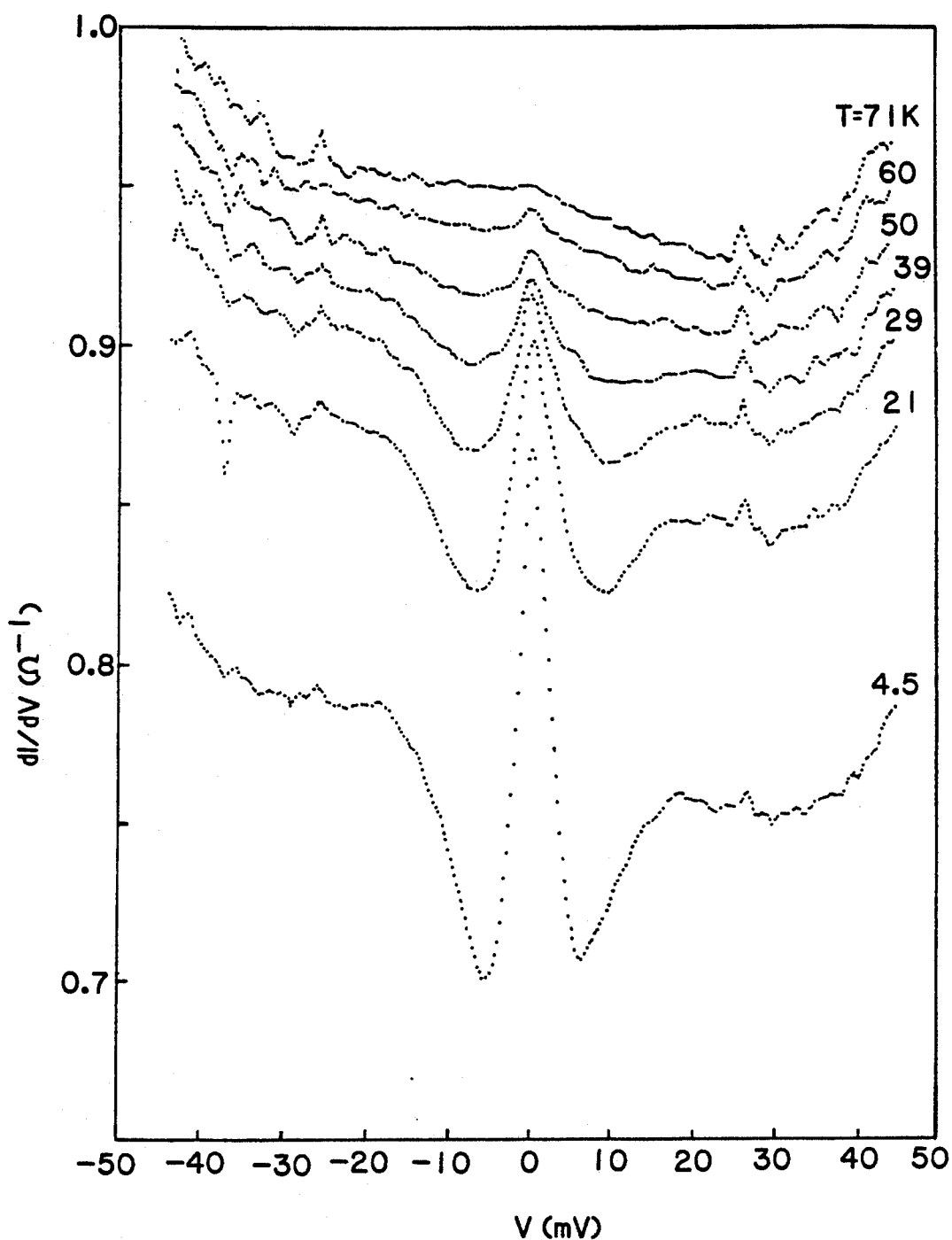
FIG. 3 shows temperature dependency of the dI/dV-V curves obtained through measurement of quasiparticle tunneling.

As shown in FIG. 1, the obtained laminated thin film consisting of the $YBa_2Cu_3O_{7-x}$ thin films 1, the $Y_2O_3$ thin film 2 and the MgO substrate 3 was assembled. Then, its resistance-temperature characteristic was measured and temperature dependence of a dI/dV-V curve was examined through measurement of quasiparticle tunneling. The results are shown in FIGS. 2 and 3.

Although the bixbyite system $Y_2O_3$ thin film was used as the insulating film in the above example, it is confirmed that the $LnBa_2Cu_3O_{7-x}$ thin film can be formed on a cubic system oxide such as MgO and $ZrO_2$ or a perovskite system oxide such as $BaTiO_3$ and $SrTiO_3$.

What is claimed is:

1. A laminated film comprising at least two thin films of single crystal $LnBa_2Cu_3O_{7-x}$ wherein Ln is Y or one of lanthanoids except Pr and Tb having the (001) plane in the direction parallel with the film surface and at least one continuous thin film of $Y_2O_3$ which has a thickness of not larger than 100 Å and the (001) plane in the direction parallel with the film surface and is interposed between a pair of said thin films of single crystal $LnBa_2Cu_3O_{7-x}$ 2. The laminated film according to claim 1, wherein said $Y_2O_3$ thin film is in the form of a single crystal.

3. The laminated film according to claim 1, wherein said $Y_2O_3$ thin film has a thickness of from 10 to 100 Å.

* * * * *